United States Patent
Huang et al.

(10) Patent No.: US 8,593,222 B2
(45) Date of Patent: Nov. 26, 2013

(54) AMPLIFIER

(75) Inventors: Ju-Lin Huang, Hsinchu County (TW); Keko-Chun Liang, Hsinchu (TW); Po-Yu Tseng, Taoyuan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 42 days.

(21) Appl. No.: 13/312,146

(22) Filed: Dec. 6, 2011

(65) Prior Publication Data

US 2012/0188015 A1  Jul. 26, 2012

Related U.S. Application Data

(60) Provisional application No. 61/436,322, filed on Jan. 26, 2011.

(30) Foreign Application Priority Data

Mar. 21, 2011 (TW) .............................. 100109596 A

(51) Int. Cl.
 *H03F 3/45* (2006.01)
(52) U.S. Cl.
 USPC .......................................... 330/257; 330/253

(58) Field of Classification Search
 USPC .................................................. 330/252–261
 See application file for complete search history.

(56) References Cited

U.S. PATENT DOCUMENTS

| 5,311,145 | A  * | 5/1994 | Huijsing et al. .............. 330/255 |
| 5,610,557 | A  * | 3/1997 | Jett, Jr. ........................... 330/261 |
| 6,194,962 | B1 * | 2/2001 | Chen ................................. 330/9 |
| 6,696,894 | B1 * | 2/2004 | Huang .......................... 330/253 |

* cited by examiner

*Primary Examiner* — Hieu Nguyen
(74) *Attorney, Agent, or Firm* — Rabin & Berdo, P.C.

(57) ABSTRACT

An amplifier includes an output stage circuit, a current source, a PMOS input pair, an NMOS input pair and a current transferring circuit. The output stage circuit is electrically coupled to a supply voltage and a ground voltage. The current source has a node to provide a current. The PMOS input pair is coupled to the node and the ground voltage and controlled by an input voltage. The NMOS input pair coupled to the supply voltage is controlled by the input voltage. The current transferring circuit is coupled to the node and the NMOS input pair. When the input voltage is less than a specific value, the current flows into the PMOS input pair through the node. When the input voltage is larger than or equal to the specific value, the current flows into the NMOS input pair through the node and the current transferring circuit.

2 Claims, 3 Drawing Sheets

AMPLIFIER

This application claims the benefits of U.S. provisional Ser. No. 61/436,222, filed Jan. 26, 2011 and Taiwan application Serial No. 100109596, filed Mar. 21, 2011, the subject matters of which are incorporated herein by reference.

BACKGROUND

1. Technical Field

The invention relates in general to a rail-to-rail amplifier.

2. Background

Referring concurrently to FIG. 1A and FIG. 1B, FIG. 1A shows a circuit diagram of a traditional rail-to-rail amplifier, and FIG. 1B shows a schematic illustration showing operation voltage regions of a traditional rail-to-rail amplifier. In the rail-to-rail amplifier 10 shown in FIG. 1A, NMOS transistors N1 and N2 form an NMOS input pair, PMOS transistors P1 and P2 form a PMOS input pair, and the NMOS input pair and the PMOS input pair are respectively coupled to current sources 12 and 14.

When an input voltage $V_i$ is less than threshold voltages of the NMOS transistors N1 and N2, the NMOS transistors N1 and N2 are turned off, so that a current of the current source 12 does not flow into an output stage circuit 16; meanwhile, the PMOS transistors P1 and P2 are turned on, so that a current of the current source 14 flows into the output stage circuit 16 for operations. In addition, when the input voltage $V_i$ is larger than threshold voltages of the PMOS transistors P1 and P2, the PMOS transistors P1 and P2 are turned off, so that the current of the current source 14 does not flow into the output stage circuit 16; meanwhile, the NMOS transistors N1 and N2 are turned on, so that the current of the current source 12 flows into the output stage circuit 16 for operations. It can be obtained from FIG. 1B that the NMOS input pair and the PMOS input pair are turned on simultaneously at some input voltage regions of the rail-to-rail amplifier 10. Compared with a single input pair amplifier, the rail-to-rail amplifier 10 has an advantage of operating at full input voltage regions, but causes unnecessary power consumption.

SUMMARY

The disclosure is directed to an amplifier, utilizing a current transferring circuit during operations to reach the same current consumption as a single input pair amplifier, thus having advantages of full input voltage operation regions and low power consumption.

According to a first aspect of the present disclosure, an amplifier is provided. The amplifier includes an output stage circuit, a current source, a PMOS input pair, an NMOS input pair and a current transferring circuit. The output stage circuit is electrically coupled to a supply voltage and a ground voltage. The current source has a node to provide a current. The PMOS input pair is coupled to the node and the ground voltage, and controlled by an input voltage. The NMOS input pair is coupled to the supply voltage and controlled by the input voltage. The current transferring circuit is coupled to the node and the NMOS input pair. When the input voltage is less than a specific value, the PMOS input pair is turned on, and the NMOS input pair and the current transferring circuit are turned off, so that the current flows into the PMOS input pair through the node. When the input voltage is larger than or equal to the specific value, the PMOS input pair is turned off, and the NMOS input pair and the current transferring circuit are turned on, so that the current flows into the NMOS input pair through the node and the current transferring circuit.

According to a second aspect of the present disclosure, an amplifier is provided. The amplifier includes an output stage circuit, a current source, an NMOS input pair, a PMOS input pair and a current transferring circuit. The output stage circuit is electrically coupled to a supply voltage and a ground voltage. The current source has a node to provide a current. The NMOS input pair is coupled to the node and the supply voltage, and controlled by an input voltage. The PMOS input pair is coupled to the ground voltage and controlled by the input voltage. The current transferring circuit is coupled to the node and the PMOS input pair. When the input voltage is larger than a specific value, the NMOS input pair is turned on, and the PMOS input pair and the current transferring circuit are turned off, so that the current flows into the NMOS input pair through the node. When the input voltage is less than or equal to the specific value, the NMOS input pair is turned off, and the PMOS input pair and the current transferring circuit are turned on, so that the current flows into the PMOS input pair through the node and the current transferring circuit.

The invention will become apparent from the following detailed description of the preferred but non-limiting embodiments. The following description is made with reference to the accompanying drawings.

DETAILED DESCRIPTION OF THE INVENTION

The disclosure proposes an amplifier, utilizing a current transferring circuit during operations to transfer current sources between a PMOS input pair and an NMOS input pair, so that the same current consumption is reached as a single input pair amplifier, thus having advantages of full input voltage operation regions and low power consumption.

Figures 1A, 1B:
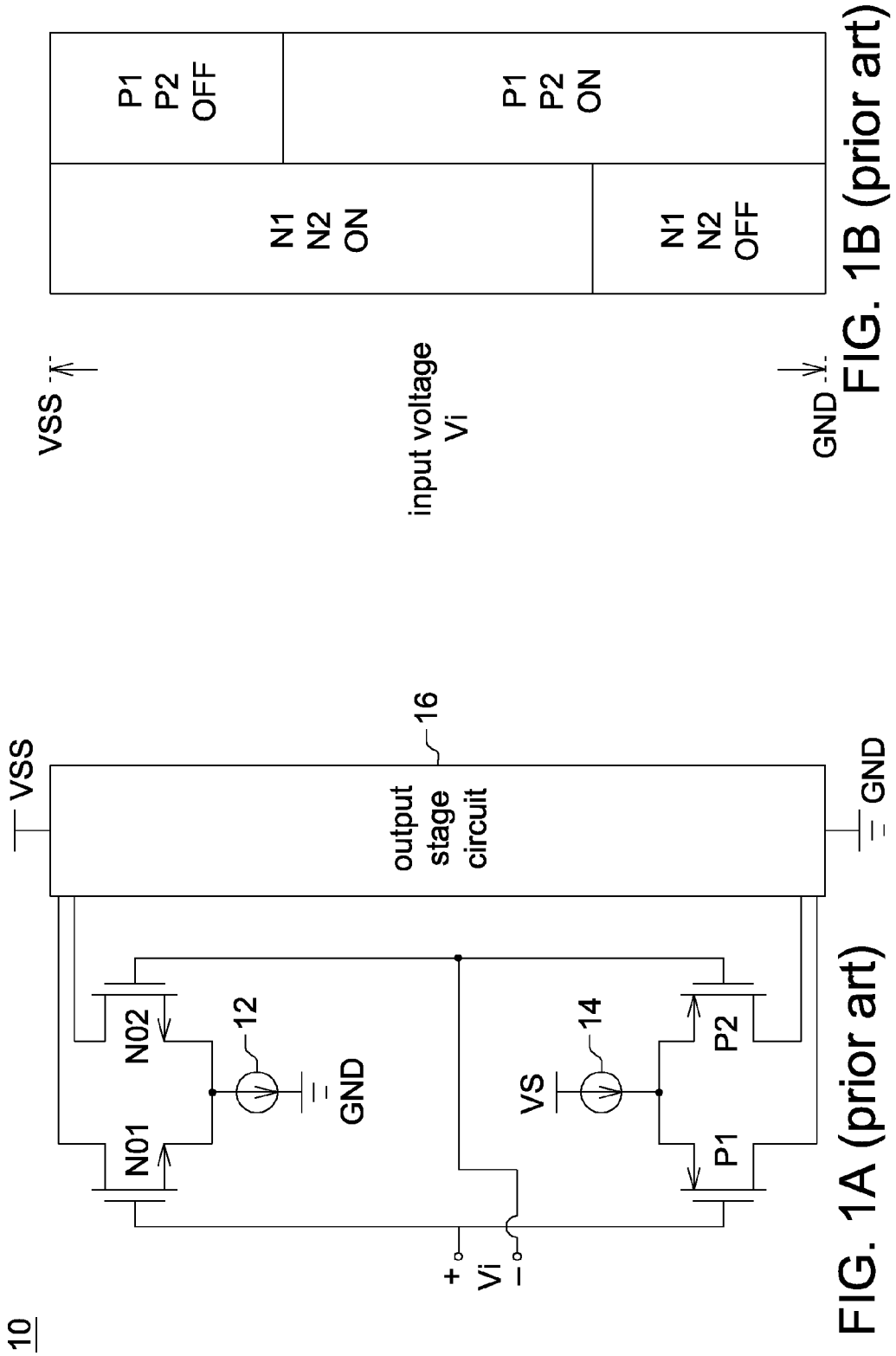
FIG. 1A shows a circuit diagram of a traditional rail-to-rail amplifier.
FIG. 1B shows a schematic illustration showing operation voltage regions of a traditional rail-to-rail amplifier.
Figures 2A, 2B:
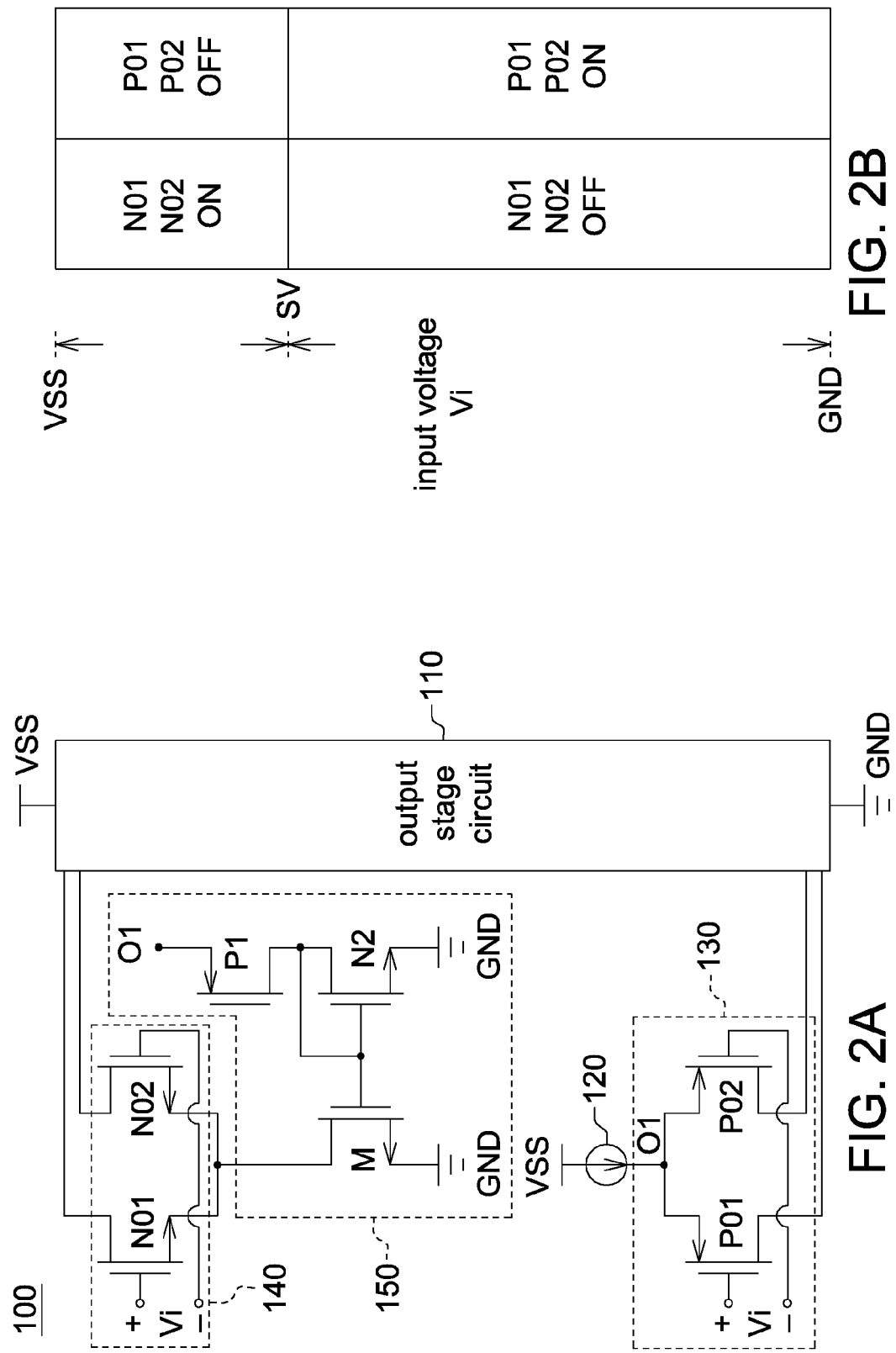
FIG. 2A shows a circuit diagram of an amplifier according to an embodiment.
FIG. 2B shows a schematic illustration showing operation voltage regions of an amplifier according to an embodiment.

Referring concurrently now to FIG. 2A and FIG. 2B, FIG. 2A shows a circuit diagram of an amplifier according to an embodiment, and FIG. 2B shows a schematic illustration showing operation voltage regions of an amplifier according to an embodiment. In FIG. 2A, the amplifier 100 is substantially a rail-to-rail amplifier, and includes an output stage circuit 110, a current source 120, a PMOS input pair 130, an NMOS input pair 140 and a current transferring circuit 150. The output stage circuit 110 is electrically coupled to a supply voltage VSS and a ground voltage GND. The current source 120 has a node O1 to provide a current. The PMOS input pair 130 is substantially composed of PMOS transistors P01 and P02, and coupled to the node O1 and electrically connected to the ground voltage GND via the output stage circuit 110. The PMOS input pair 130 is controlled by an input voltage $V_i$.

The NMOS input pair 140 is substantially composed of NMOS transistors N01 and N02, and is electrically connected to the supply voltage VSS via the output stage circuit 110 and controlled by the input voltage $V_i$. The current transferring circuit 150 is coupled to the node O1 and the NMOS input pair 140. The current transferring circuit 150 includes a first NMOS transistor N1, a second NMOS transistor N2 and a first PMOS transistor P1. The first NMOS transistor N1 has a first terminal coupled to the NMOS input pair 140, and a second terminal coupled to the ground voltage GND.

The second NMOS transistor N2 has a first terminal coupled to a control terminal of the first NMOS transistor N1, a second terminal coupled to the ground voltage GND, and a control terminal coupled to the control terminal of the first NMOS transistor N1. The first PMOS transistor P1 has a first terminal coupled to the node O1, a second terminal coupled to the first terminal of the second NMOS transistor N2, and a control terminal for receiving a control voltage V1, which is related to the input voltage $V_i$ and a threshold voltage of the first PMOS transistor P1.

When the input voltage $V_i$ is less than a specific value SV, the PMOS transistors P01 and P02 are turned on, so that the PMOS input pair 130 is turned on; meanwhile, the NMOS input pair 140 and the current transferring circuit 150 are turned off, so that the current provided by the current source 120 flows into the PMOS input pair 130 through the node O1, and then transmitted to the output stage circuit 110 for operations. The specific value SV is about the sum of the control voltage V1 and the threshold voltage of the first PMOS transistor P1 minus a voltage difference between the input voltage $V_i$ and the node O1.

The voltage at the node O1 raises as the input voltage $V_i$ raises. When the input voltage $V_i$ is larger than or equal to the specific value SV, the NMOS transistors N01 and N02 are turned on, so that the NMOS input pair 140 is turned on; meanwhile, the PMOS input pair 130 is turned off. At the same time, the current transferring circuit 150 is turned on and the first PMOS transistor P1 is turned on, so that the current provided by the current source 120 flows into the NMOS input pair 140 through the O1 and the current transferring circuit 150 by utilizing a current mirror composed of the first NMOS transistor N1 and the second NMOS transistor N2. Then the current is transmitted to the output stage circuit 110 for operations.

Consequently, the NMOS input pair 140 is capable of operating at the input voltage region at which the PMOS input pair 130 is turned off, and has the advantage of full input voltage operation regions. Furthermore, the input voltage region that could turn on the NMOS input pair 140 can be decided by utilizing the control voltage V1. In addition, it can be obtained from FIG. 2B that, only one of the PMOS input pair 130 and the NMOS input pair 140 could be turned on corresponding to any input voltages, thus capable of achieving the goal of current saving. And the operation current is the same as the single input pair amplifier because of removing a tail current source corresponding to the NMOS input pair 140.

Figures 3A, 3B:
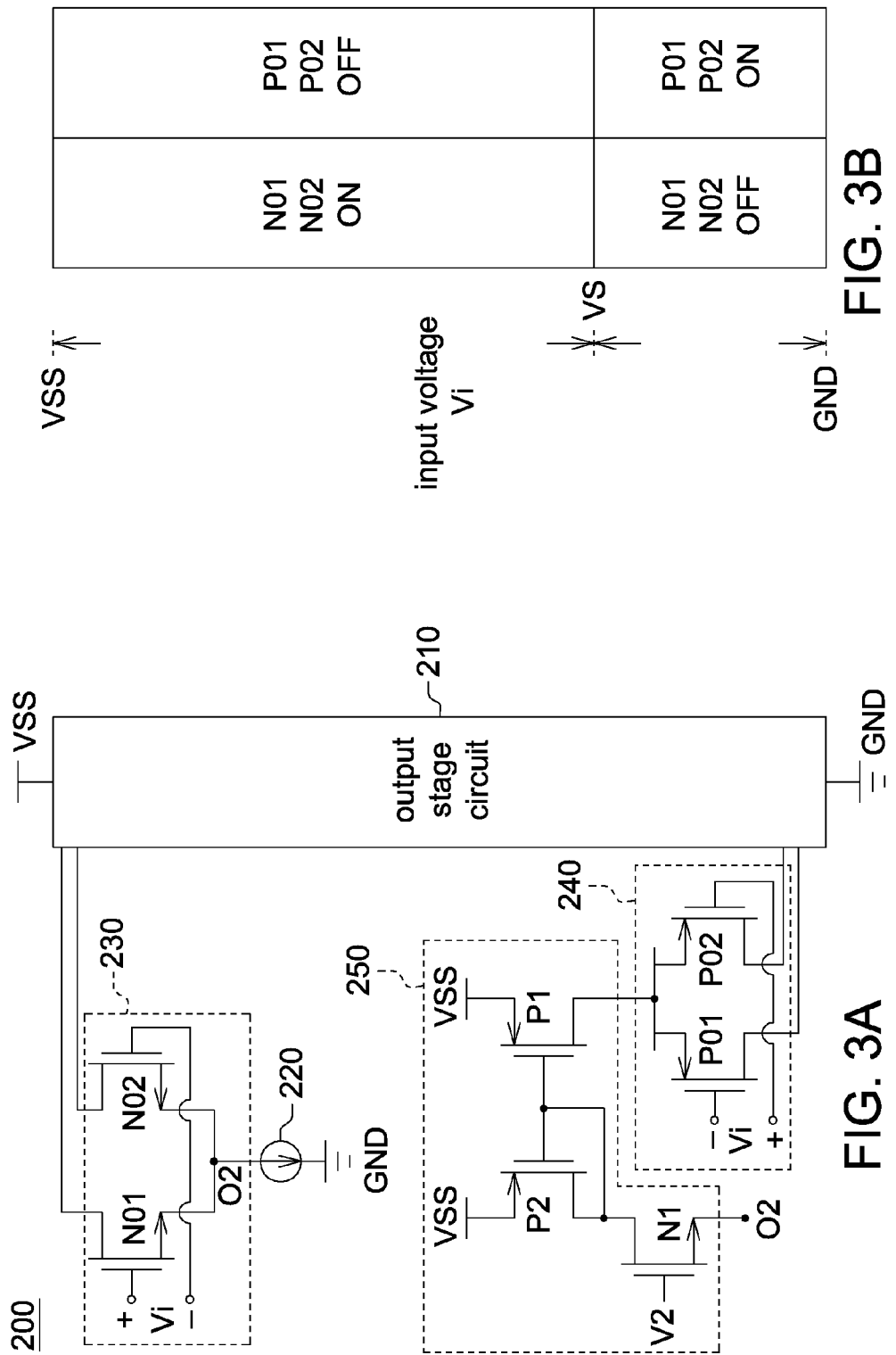
FIG. 3A shows a circuit diagram of an amplifier according to another embodiment.
FIG. 3B shows a schematic illustration showing operation voltage regions of another amplifier according to an embodiment.

Referring concurrently now to FIG. 3A and FIG. 3B, FIG. 3A shows a circuit diagram of an amplifier according to another embodiment, and FIG. 2B shows a schematic illustration showing operation voltage regions of an amplifier according to another embodiment. In FIG. 3A, the amplifier 200 is substantially a rail-to-rail amplifier, and includes an output stage circuit 210, a current source 220, an NMOS input pair 230, a PMOS input pair 240 and a current transferring circuit 250. The output stage circuit 210 is electrically coupled to a supply voltage VSS and a ground voltage GND. The current source 220 has a node O2 to provide a current. The NMOS input pair 230 is substantially composed of NMOS transistors N01 and N02, and coupled to the node O2 and electrically connected to the supply voltage VSS via the output stage circuit 210. The NMOS input pair 230 is controlled by an input voltage $V_i$.

The PMOS input pair 240 is substantially composed of PMOS transistors P01 and P02, and is electrically connected to the ground voltage GND via the output stage circuit 210 and controlled by the input voltage $V_i$. The current transferring circuit 250 is coupled to the node O2 and the PMOS input pair 240. The current transferring circuit 250 includes a first PMOS transistor P1, a second PMOS transistor P2 and a first NMOS transistor N1. The first PMOS transistor P1 has a first terminal coupled to the PMOS input pair 240, and a second terminal coupled to the supply voltage VSS.

The second PMOS transistor P2 has a first terminal coupled to a control terminal of the first PMOS transistor P1, a second terminal coupled to the supply voltage VSS, and a control terminal coupled to the control terminal of the first PMOS transistor P1. The first NMOS transistor N1 has a first terminal coupled to the node O2, a second terminal coupled to the first terminal of the second PMOS transistor P2, and a control terminal for receiving a control voltage V2, which is related to the input voltage $V_i$ and a threshold voltage of the first NMOS transistor N1.

When the input voltage $V_i$ is larger than a specific value SV, the NMOS transistors N01 and N02 are turned on, so that the NMOS input pair 230 is turned on; meanwhile, the PMOS input pair 240 and the current transferring circuit 250 are turned off, so that the current provided by the current source 220 flows into the NMOS input pair 230 through the node O2, and then transmitted to the output stage circuit 210 for operations. The specific value SV is about the sum of the control voltage V2 and the threshold voltage of the first NMOS transistor N1 minus a voltage difference between the input voltage $V_i$ and the node O2.

The voltage at the node O2 lowers as the input voltage $V_i$ lowers. When the input voltage $V_i$ is less than or equal to the specific value SV, the PMOS transistors P01 and P02 are turned on, so that the PMOS input pair 240 is turned on; meanwhile, the NMOS input pair 230 is turned off. At the same time, the current transferring circuit 250 is turned on and the first NMOS transistor N1 is turned on, so that the current provided by the current source 220 flows into the PMOS input pair 240 through the node O2 and the current transferring circuit 250 by utilizing a current mirror composed of the first PMOS transistor P1 and the second PMOS transistor P2. Then the current is transmitted to the output stage circuit 210 for operations.

Consequently, the PMOS input pair 240 is capable of operating at the input voltage region at which the NMOS input pair 230 is turned off, and has the advantage of full input voltage operation regions. Furthermore, the input voltage region that could turn on the PMOS input pair 240 can be decided by utilizing the control voltage V2. In addition, it can be obtained from FIG. 3B that, only one of the NMOS input pair 230 and the PMOS input pair 240 could be turned on corresponding to any input voltages, thus capable of achieving the goal of current saving. And the operation current is the same as the single input pair amplifier because of removing a tail current source corresponding to the PMOS input pair 240.

The amplifier disclosed in the disclosure replaces a traditional tail current source with a current transferring circuit, thus capable of transferring current sources between the PMOS input pair and the NMOS input pair during operations, so that the same current consumption is reached as a single input pair amplifier, thus having advantages of full input voltage operation regions and low power consumption.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An amplifier, comprising:
    an output stage circuit electrically coupled to a supply voltage and a ground voltage;
    a current source having a node to provide a current;
    a PMOS input pair coupled to the node and the ground voltage, and controlled by an input voltage;
    an NMOS input pair coupled to the supply voltage and controlled by the input voltage; and
    a current transferring circuit coupled to the node and the NMOS input pair;
    wherein when the input voltage is less than a specific value, the PMOS input pair is turned on, and the NMOS input pair and the current transferring circuit are turned off, so that the current flows into the PMOS input pair through the node; and when the input voltage is larger than or equal to the specific value, the PMOS input pair is turned off, and the NMOS input pair and the current transferring circuit are turned on, so that the current flows into the NMOS input pair through the node and the current transferring circuit;
    wherein the current transferring circuit includes:
        a first NMOS transistor having a first terminal coupled to the NMOS input pair, and a second terminal coupled to the ground voltage,
        a second NMOS transistor having a first terminal coupled to a control terminal of the first NMOS transistor, a second terminal coupled to the ground voltage, and a control terminal coupled to the control terminal of the first NMOS transistor, and
        a first PMOS transistor having a first terminal coupled to the node, a second terminal coupled to the first terminal of the second NMOS transistor, and a control terminal for receiving a control voltage; and
    wherein the specific value is the sum of the control voltage and the threshold voltage of the first PMOS transistor minus a voltage difference between the input voltage and the node.

2. An amplifier, comprising:
    an output stage circuit electrically coupled to a supply voltage and a ground voltage;
    a current source having a node to provide a current;
    an NMOS input pair coupled to the node and the supply voltage, and controlled by an input voltage;
    a PMOS input pair coupled to the ground voltage and controlled by the input voltage; and
    a current transferring circuit coupled to the node and the PMOS input pair, wherein when the input voltage is larger than a specific value, the NMOS input pair is turned on, and the PMOS input pair and the current transferring circuit are turned off, so that the current flows into the NMOS input pair through the node; and when the input voltage is less than or equal to the specific value, the NMOS input pair is turned off, and the PMOS input pair and the current transferring circuit are turned on, so that the current flows into the PMOS input pair through the node and the current transferring circuit, the current transferring circuit including:
        a first PMOS transistor having a first terminal coupled to the PMOS input pair, and a second terminal coupled to the supply voltage;
        a second PMOS transistor having a first terminal coupled to a control terminal of the first PMOS transistor, a second terminal coupled to the supply voltage, and a control terminal coupled to the control terminal of the first PMOS transistor, and
        a first NMOS transistor having a first terminal coupled to the node, a second terminal coupled to the first terminal of the second PMOS transistor, and a control terminal for receiving a control voltage,
    wherein the specific value is the sum of the control voltage and the threshold voltage of the first PMOS transistor minus a voltage difference between the input voltage and the node.

* * * * *